United States Patent [19]
Akatsu et al.

[11] Patent Number: 6,060,388
[45] Date of Patent: *May 9, 2000

[54] CONDUCTORS FOR MICROELECTRONIC CIRCUITS AND METHOD OF MANUFACTURE

[75] Inventors: Hiroyuki Akatsu, Yorktown Heights; Russell H. Arndt; Bradley P. Jones, both of Wappingers Falls; George F. Ouimet, Millbrook, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/960,208

[22] Filed: Oct. 29, 1997

[51] Int. Cl.⁷ .................................................. H01L 21/4763
[52] U.S. Cl. ......................... 438/637; 438/639; 438/640; 438/672
[58] Field of Search .................................. 438/300, 305, 438/422, 586, 627, 626, 629, 641, 675, 678, 645, 656, 628, 637, 639, 640, 672

[56] References Cited

U.S. PATENT DOCUMENTS

| | | | |
|---|---|---|---|
| 4,776,087 | 10/1988 | Cronin et al. | 29/828 |
| 5,338,897 | 8/1994 | Tsay et al. | 174/35 R |
| 5,363,550 | 11/1994 | Aitken et al. | 29/828 |
| 5,403,779 | 4/1995 | Joshi et al. | 438/631 |
| 5,510,645 | 4/1996 | Fitch et al. | 257/522 |
| 5,550,076 | 8/1996 | Chen | 437/52 |
| 5,661,080 | 8/1997 | Hwang et al. | 438/654 |
| 5,670,425 | 9/1997 | Schinella et al. | 438/645 |
| 5,801,095 | 9/1996 | Huang et al. | 438/627 |
| 5,891,807 | 9/1997 | Muller et al. | 438/713 |

FOREIGN PATENT DOCUMENTS

| | | |
|---|---|---|
| 0332106 | 9/1989 | European Pat. Off. . |
| 58-42227 | 3/1983 | Japan . |
| 61-93618 | 5/1986 | Japan . |

*Primary Examiner*—Charles Bowers
*Assistant Examiner*—Reneé R. Berry
*Attorney, Agent, or Firm*—Whitham, Curtis & Whitham; Jay L. Anderson

[57] ABSTRACT

An integrated circuit (IC) conductor and the process of making the conductor. The conductor may be a monofilament conductor, a clad conductor or a coaxial conductor. A trench is formed in a dielectric layer. An outer material layer is deposited on the dielectric layer and in the trench, thick enough that the outer material layer merges together in a seam over the trench forming a void under the seam. The outer material layer is dielectric for the monofilament conductor, a cladding material for the clad conductor and conducting material for the coaxial conductor. The void is filled with a conductor for a monofilament or clad conductors. An inner dielectric liner layer is formed on the walls of the void and a core conductor is formed on the liner layer for the coaxial conductor.

24 Claims, 7 Drawing Sheets

CONDUCTORS FOR MICROELECTRONIC CIRCUITS AND METHOD OF MANUFACTURE

BACKGROUND OF THE INVENTION

1. Field of the Invention

The present invention is related to coaxial conductors and, more particularly, to processes of integrating coaxial conductors onto integrated circuit chips.

2. Background Description

Coaxial cables are well known. Miniature coaxial cables are also well known. Coaxial cables are widely used for low loss data transmission. Signals transmitted on coaxial cables are shielded from exterior noise that might otherwise interfere with signals on an unshielded line.

To reduce signal loss, signals transmitted on coaxial cable require termination for impedance matching. Typical impedance matching termination on an integrated circuit (IC) chip is a resistor tied at one end to a supply.

Very few IC processes include coaxial signal distribution conductors because of the difficulty in fabricating coaxial structures in IC processes. Further, prior art coaxial conductors have irregularities in spacing between the core conductor and the outer shield conductor. These irregularities lead to nonuniform characteristic impedance along the conductor. The nonuniformity in the characteristic impedance introduces noise from reflections and attenuations into signals on the core conductor.

Thus there is a need for coaxial conductors in ICs that have uniform spacing between the core conductor and the outer shield conductor.

SUMMARY OF THE INVENTION

It is a purpose of the invention to reduce noise on signals transmitted on integrated circuit chips.

It is another purpose of the present invention to simplify fabrication of coaxial conductors on integrated circuit chips.

The present invention is an integrated circuit (IC) conductor and the process of making the conductor. In a first preferred embodiment, the conductor is a coaxial conductor. Multiple conductors may be included in the first preferred embodiment to form, for example triaxial conductors. In a second preferred embodiment, the conductor is a clad conductor. In a third preferred embodiment, the conductor is a monofilament conductor.

First, in all three preferred embodiments, a trench is formed in a dielectric layer. An outer material layer is deposited on the dielectric layer and in the trench. The deposited outer layer is thick enough that as it forms along the sidewalls of the trench, it builds up along the surface edges of the trench until it merges together in a seam over the trench forming a void under the seam. The outer material layer is conducting material for the first embodiment coaxial conductor, a cladding material for the second embodiment clad conductor and dielectric for the third embodiment monofilament conductor. For the first embodiment, an inner dielectric liner layer is formed on the walls of the void and a core conductor is formed in the liner layer to form the coaxial conductor. The void is filled with a conductor for both the clad and monofilament conductors.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is a family of dielectric encased conductors for integrated circuit (IC) chips and the method of making the conductors on IC chips. In one preferred embodiment the conductor is a coaxial conductor. In a second preferred embodiment, the conductor is a clad conductor. In a third preferred embodiment, the conductor is a monofilament conductor.

FIGS. 1A–C to 6A–C show the first preferred embodiment conductor, a coaxial conductor for microelectronic circuits, after preferred steps of making the conductor. FIGS. 1A–6A are a plan view, FIGS. 1B–6B are respective cross-sectional views through B—B and FIGS. 1C–6C are respective cross-sectional views through C—C.

Figure 1A:
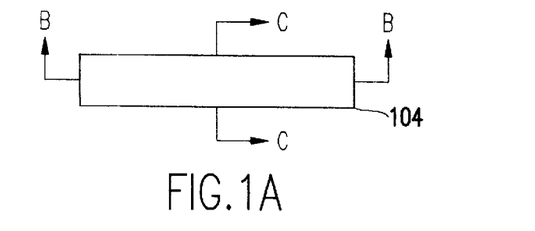
FIGS. 1A–C show a trench formed for first preferred embodiment, coaxial conductor.
Figure 1B:
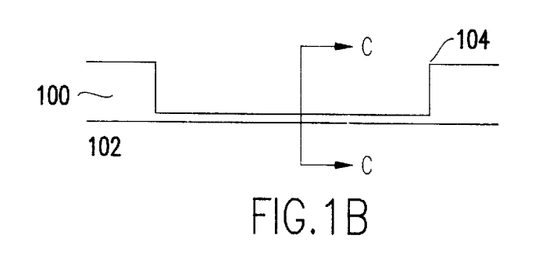
Figure 1C:
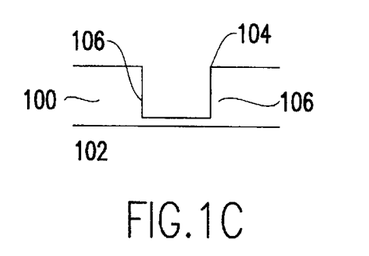

First, in FIGS. 1A–1C, a 0.1 micron ($\mu$m) to 100 $\mu$m thick outer dielectric layer 100 of insulating material is formed on a semiconductor wafer 102. Preferably the insulating material is silicon oxide, the layer 100 is slightly thicker than 5000 Å and the wafer 102 is silicon. Next, a 5000 Å deep trench 104 is formed in the outer dielectric layer 100, preferably using lithography and reactive ion etching (RIE). The trench 104 defines the size and shape of an outer conductor. Alternatively, any suitable etching technique may be substituted for RIE. Preferably, although not required, the walls 106 of the trench 104 are bowed out, so that the trench's width is greater at its middle than at its top. Preferably, each trench's aspect ratio (height/width) is $\geq 1$.

Figure 2A:
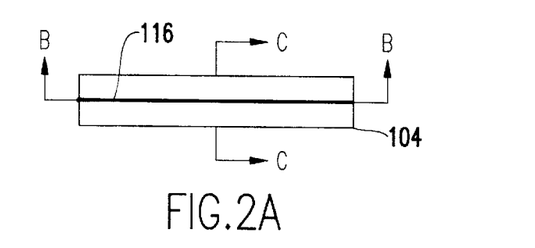
FIGS. 2A–C show the outer conductor an a void formed therein in the trench of FIGS. 1A–C.
Figure 2B:
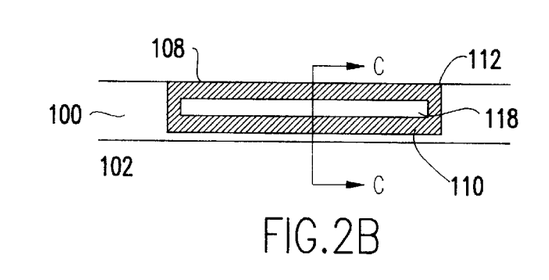
Figure 2C:
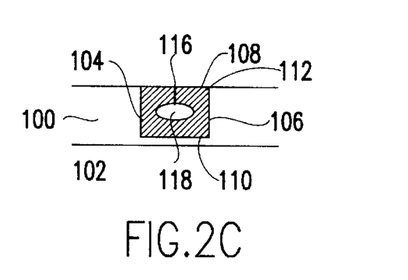

Next, in FIGS. 2A–C, an outer conductor 108 is formed in the trench 104. The outer conductor 108 is analogous to the wire mesh shield in state of the art coaxial cables. To form the outer conductor 108, a very thin seed layer 112 of TiN over Ti is deposited on the outer dielectric layer 100 and in the trench 104. Preferably, the seed layer thickness at the bottom 110 of the trench 104 should be, depending on the trench dimensions, 30–3000 Å TiN, preferably 50 Å, on 30–3000 Å Ti, preferably 50 Å.

Then, the outer conductor 108 is formed on the seed layer. Preferably, the outer conductor 108 is a 3000 Å tungsten layer deposited by chemical vapor deposition (CVD). Preferably, the deposited conductor material thickness, essentially, is uniform on the field and in the trench 104, on its sides 106 and bottom 110. Deposition of the outer conductor 108 continues until the material build up along the trench's sidewalls 106, is thick enough to seam together, merging together to form seam 116, while leaving a void 118 beneath and running along the length of the seam. Thus, the deposited conductor material must be sufficiently thick that the seam forms at the top of the trench, while a void or "low density" material remains embedded in the outer conductor material, along the whole length of the seam. Excess metal is removed from the field, (the wafer's surface around the trench 104) preferably by chem-mech polishing (CMP) the wafer.

Optionally, a capping dielectric layer may be formed on the outer conductor 108 at this point. However, preferably, the capping dielectric layer is formed later in the process, after an inner dielectric & conductor are formed.

Figure 3A:
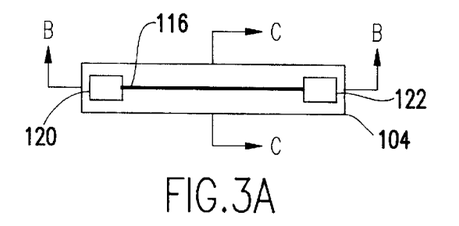
FIGS. 3A–C show accesses opened through the outer conductor of FIGS. 2A–C.
Figure 3B:
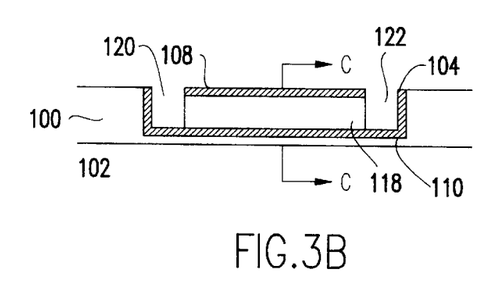
Figure 3C:
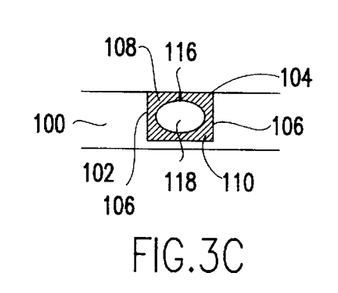

After forming the outer conductor 108, in FIGS. 3A–C, an access 120, 122 is opened to the void 118 at each end of the outer conductor 108 and the void 118 is widened along the length of the outer conductor 108. First, the access holes 120, 122 are etched in the ends of the outer conductor 108 to expose the void 118. Then, the void 118 is etched to enlarge its diameter to 3000 Å. In the preferred embodiment, the outer conductor material, W, is etched with $HNO_3/HF$. Optionally, if the coaxial line is to be connected to a lower level, the access hole may be sub-etched below the bottom of the outer conductor, preferably using reactive ion etching (RIE) to etch to a conductor (not shown) below.

Figure 4A:
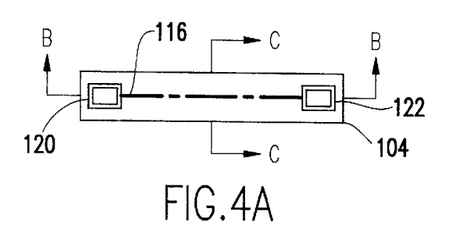
FIGS. 4A–C show a dielectric liner formed on the outer conductor in the void.
Figure 4B:
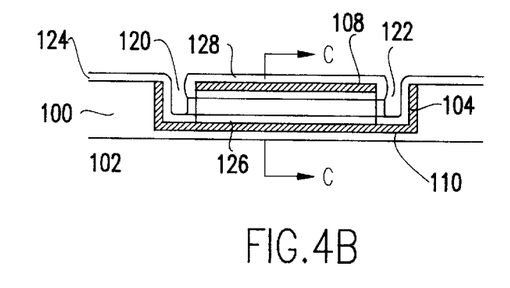
Figure 4C:
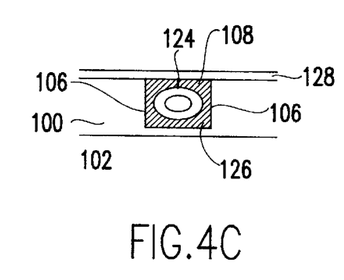

Next, in FIGS. 4A–C, a dielectric liner 124 is formed lining the void 118. Preferably, an 1000 Å silicon oxide layer 124 is formed on the inner surface 126 using CVD. The liner 124 must completely coat the inner surface 126 of the void 118 without plugging it. The dielectric liner 124 is insulates the preferred coaxial conductor's inner conducting core from the outer conductor 108. In the preferred embodiment, as the dielectric liner 124 is formed, a dielectric cap 128 forms, simultaneously, on the top surface of the outer conductor 108.

Optionally, after forming the dielectric liner 124, dielectric at the bottom of the access holes 120, 122 may be removed, exposing a lower level conductor (not shown) using an anistropic etch. Additionally, contacts may be opened through the dielectric cap 128. So, the dielectric is patterned using normal photo-lithographic processes and anisotropically etched, e.g., RIE. Alternately, a blanket RIE without patterning may be used to remove the dielectric from both the bottom of the access holes 120, 122 and surface of the wafer.

Figure 5A:
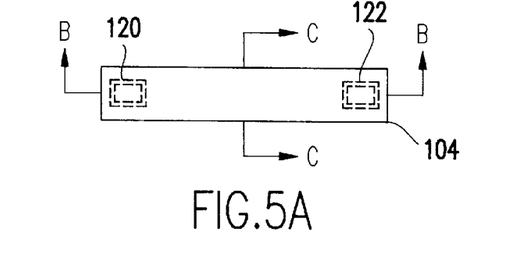
FIGS. 5A–C show the core conductor filling the void in the dielectric liner.
Figure 5B:
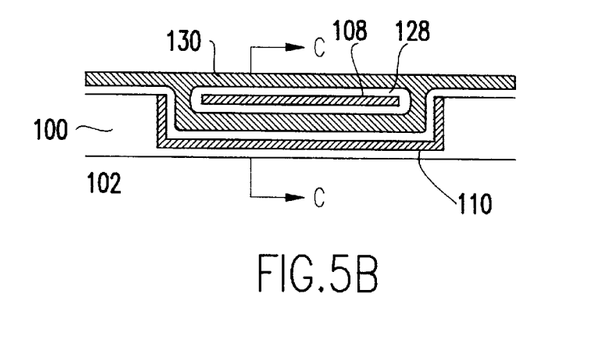
Figure 5C:
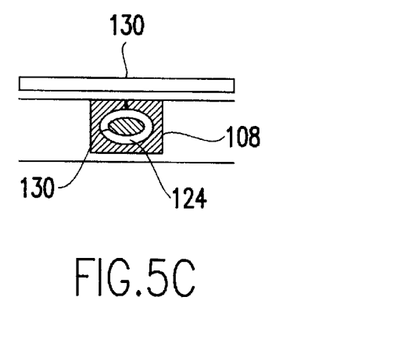

Next, in FIGS. 5A–C, a core conductor 130 is formed in and along the length of the inner dielectric 124. Preferably, the core conductor 130 is deposited by CVD, first depositing a seed layer of TiN followed by CVD of tungsten. Optionally, if the conductor length exceeds the CVD fill capability, intermediate access holes (not shown), identical to 120, 122 formed at each end in the present example, may be included, as required, along the length of the trench 104.

Figure 6A:
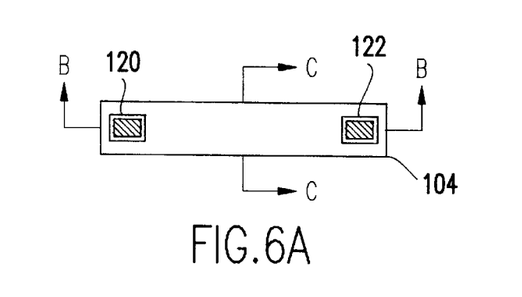
FIGS. 6A–C show the first preferred embodiment coaxial conductor.
Figure 6B:
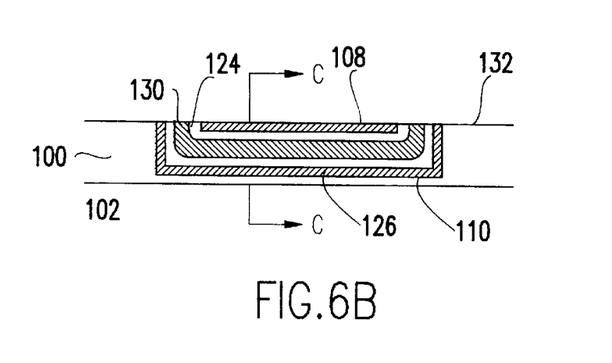
Figure 6C:
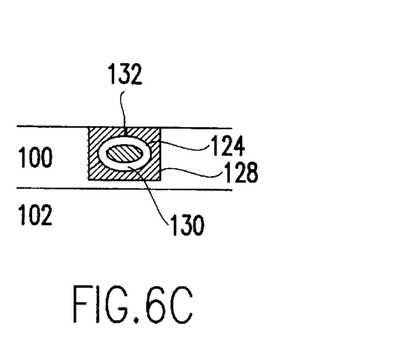

Finally, in FIGS. 6A–C, excess conductor is removed from the surface 132. The excess conductor may be removed using an appropriate CMP or RIE technique. Once the coaxial conductor is completed, the outer and core conductors can be contacted by standard semiconductor circuit connection methods.

In an alternate example of this first preferred embodiment, a 7000 Å deep and 2500 Å wide trench is formed in a surface $SiO_2$ layer located on a silicon wafer. A 6000 Å outer conductor layer of polysilicon may be formed on the wafer and over the 7000 Å by 2500 Å trench using CVD. Excess conductor may be removed from the field using CMP. As in the first preferred embodiment, the polysilicon seams above a void in the trench. Access holes are opened through the polysilicon outer conductor at each end of the trench. An isotropic etchant such as a mixture of $NH_4OH$, $H_2O_2$ in deionized water may be used to etch the polysilicon from within the void to enlarge the void diameter to 500 Å. A 150 Å dielectric liner, of $Si_3N_4$ is deposited in the void using CVD. The liner must completely coat the inner polysilicon surface without plugging the void, leaving a void diameter of 200 Å. Finally, an As doped polysilicon core conductor is deposited to fill the void.

Further, this first preferred embodiment may be used for multiple levels of wiring, by repeating the steps depicted in FIGS. 1A–C to 6A–C on the surface above the structure in FIGS. 6A–C.

In another alternate embodiment of this first preferred embodiment the method of forming the coaxial conductor is extended to three or more coaxial conducting layers, e.g., three conductors forming a triaxial conductor. In this alternate embodiment, a deeper & wider trench may be combined with thinner dielectric and conductor layers such that the second conductor (the core conductor in the first preferred embodiment) lines, but does not completely fill the void 118.

Then, for this alternate embodiment, a third dielectric layer (not shown) is deposited on the second conductor, leaving the void 118 open for the third conductor. Additional dielectric and conducting layers may be identically formed as desired until the void 118 has been filled with a core conductor or dielectric. As with the first preferred embodiment, once the core coaxial conductor is completed, the coaxial conductors can be contacted by standard semiconductor circuit connection methods.

FIGS. 7A–C to 10A–C show the second preferred embodiment conductor, a clad conductor for microelectronic circuits, after preferred steps of making the conductor. FIGS. 7A–10A are a plan view, FIGS. 7B–10B are respective cross-sectional views through B—B and FIGS. 7C–10C are respective cross-sectional views through C—C.

The first step in the second preferred embodiment is to form a trench 104 in a surface dielectric layer 100 in FIGS. 1A–C.

Figure 7A:
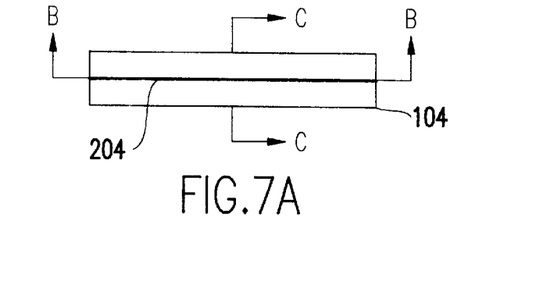
FIGS. 7A–C show a cladding layer formed in the trench of FIGS. 1A–C in the second preferred embodiment clad conductor.
Figure 7B:
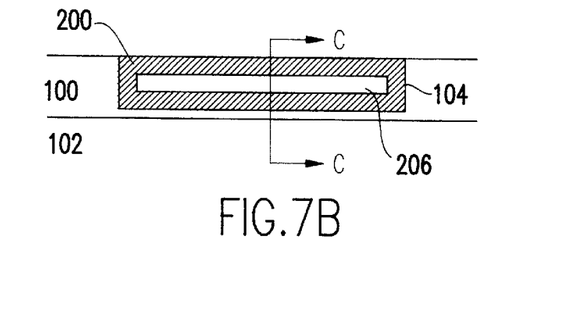
Figure 7C:
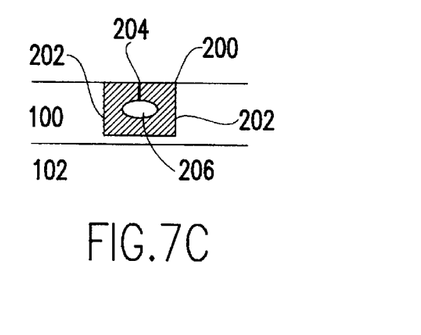

After defining the trench 104, in FIGS. 7A–C, a cladding layer 200 is deposited by CVD. The cladding layer may be conductive, wherein tantalum is deposited or, dielectric wherein silicon nitride is deposited. Alternately, the conductive cladding material may be Al, Mg, a refractory metal or a compound thereof, including, for example, nitrides, suicides, carbides and borides.

As with the outer conductor 108 in FIGS. 2A–C, the cladding layer field thickness and thickness on the sides & bottom of the trench, preferably, are identical. As with the outer conductor 108, cladding layer 200 deposition continues until the material build up along the trench's sidewalls 202, is thick enough to seam together, merging together to form seam 204, while leaving a void 206 beneath and running along the length of the seam 204. Thus, the deposited conductor material must be sufficiently thick that the seam 204 forms at the top of the trench 104, while a void 206 or "low density" material remains embedded in the cladding material, along the whole length of the seam 204. As with the first preferred embodiment, optionally, a capping dielectric layer may be formed at this point, or after the core conductor is formed.

Figure 8A:
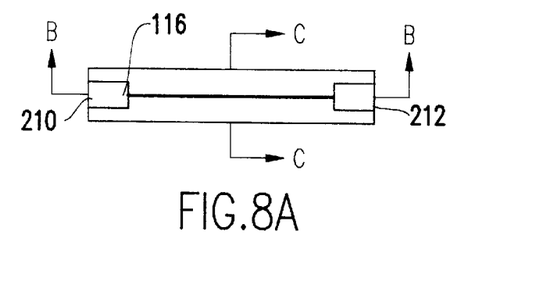
FIGS. 8A–C show accesses opened through the cladding layer of FIGS. 7A–C to the void.
Figure 8B:
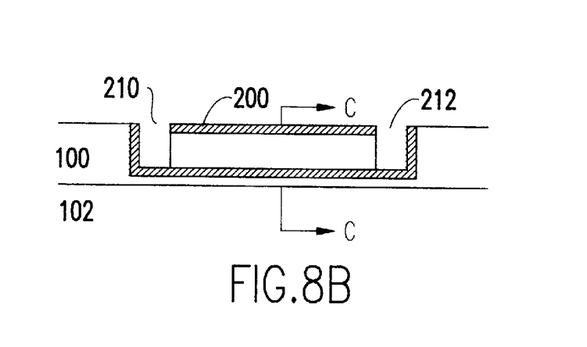
Figure 8C:
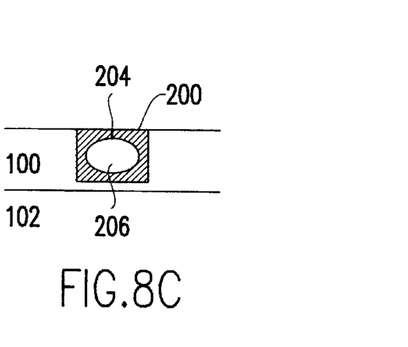

Next in FIGS. 8A–C, as in FIGS. 3A–C, an access 210, 212 is opened to the void 206 at each end of the cladding layer 200 and the void 206 is enlarged along the length of the cladding layer 200. Access holes 210, 212 are etched in the ends of the cladding layer 200 to expose the void 206. After opening the access holes 210, 212 the void 200 is etched to enlarge it to 3000 Å. In the preferred embodiment, the cladding layer 200 is etched with $HNO_3/HF$ for Ta or hot $H_3PO_4$ for silicon nitride cladding. Optionally, if the coaxial line is to be connected to a lower level, the access hole may be sub-etched below the bottom of the outer conductor, preferably using reactive ion etching (RIE) to connect to a conductor (not shown) below it.

Figure 9A:
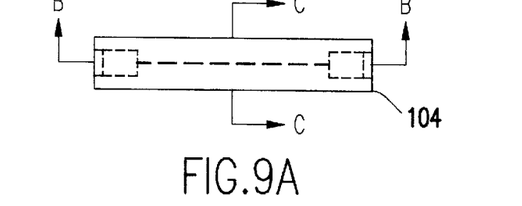
FIGS. 9A–C show conductor material filling the void.
Figure 9B:
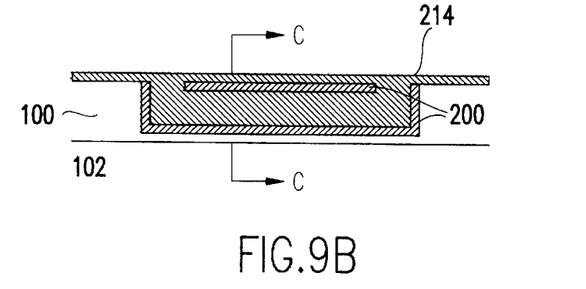
Figure 9C:
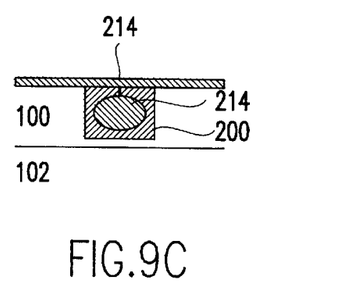

Next, in FIGS. 9A–C, the core conductor 214 is deposited along the length of the void 206. Preferably, the core conductor 214 material is Cu deposited by plating or CVD. Alternately, the core material may be Al, Co, W, Si, doped Si or Mo. Optionally, as with the first preferred embodiment, if the conductor length exceeds the CVD fill capability, intermediate access holes (not shown), identical to those formed 210, 212 at each end in the present example, may be included, as required, along the length of the trench 104.

Figure 10A:
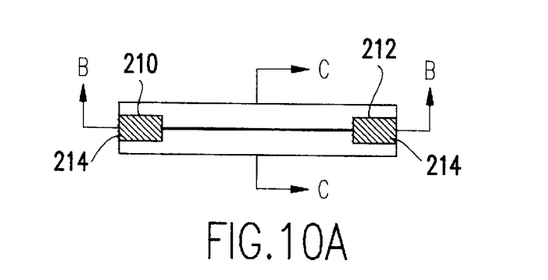
FIGS. 10A–C show the second preferred embodiment clad conductor.
Figure 10B:
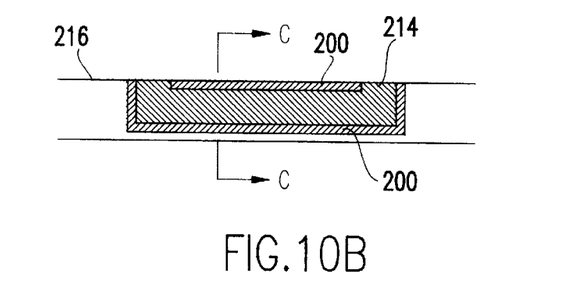
Figure 10C:
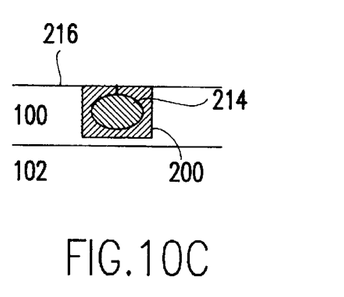

Finally, in FIGS. 10A–C, excess conductor is removed from the surface 216. The excess conductor may be removed using an appropriate CMP or RIE technique. Once the clad conductor is completed, the conductor may be contacted by standard semiconductor circuit connection methods.

FIGS. 11A–C to 14A–C show the third preferred embodiment conductor, a monofilament conductor for microelectronic circuits, after preferred steps of making the conductor. FIGS. 11A–14A are a plan view, FIGS. 11B–14B are respective cross-sectional views through B—B and FIGS. 11C–14C are respective cross-sectional views through C—C.

The first step in the third preferred embodiment is to form a trench 104 in a surface dielectric layer 100 in FIGS. 1A–C.

Figure 11A:
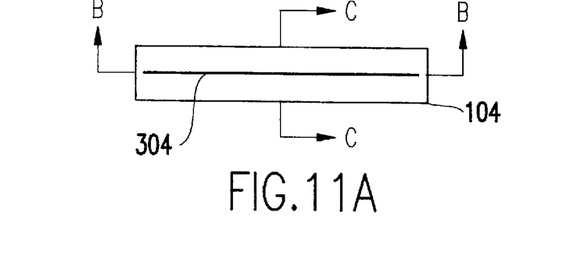
FIGS. 11A–C show an outer dielectric layer with a void therein in the trench of FIGS. 1A–1C.
Figure 11B:
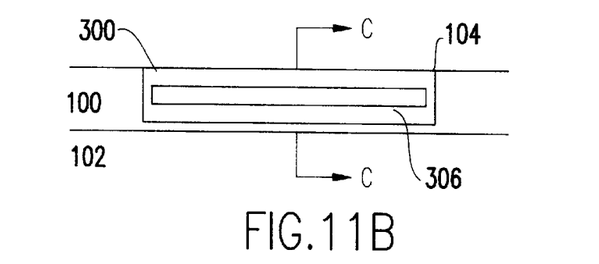
Figure 11C:
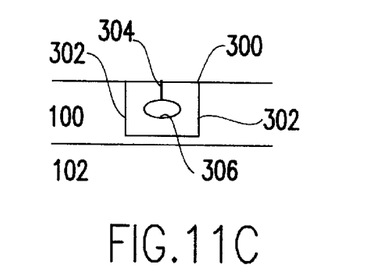

After defining the trench 104, in FIGS. 11A–C, a second outer dielectric 300, preferably of silicon oxide is formed on the wafer, preferably by CVD. As with the outer conductor 108 in FIGS. 2A–C, the second outer dielectric 300 thickness in the field and on the sides and bottom of the trench, preferably, are identical. As with the outer conductor 108, second outer dielectric 300 deposition continues until the material build up along the trench's sidewalls 302, is thick enough to seam together, merging together to form seam 304, while leaving a void 306 beneath and running along the length of the seam 304. Thus, the deposited second dielectric material must be sufficiently thick that the seam 304 forms at the top of the trench 104, while a void 306 or "low density" material remains embedded in the second dielectric material, along the whole length of the seam 304.

Optionally, excess dielectric may be removed from the field of the wafer (outside the trench) by CMP or RIE. As with the first preferred embodiment, optionally, a capping dielectric layer may be formed at this point, or after the monofilament conductor is formed.

Figure 12A:
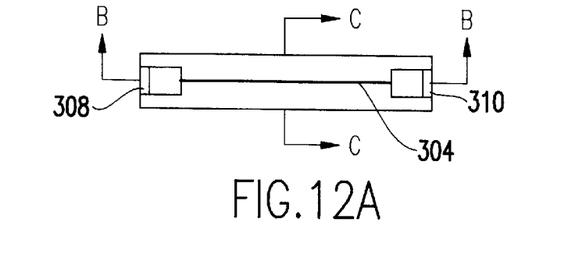
FIGS. 12A–C show accesses opened through the outer dielectric layer to the void of FIGS. 11A–C.
Figure 12B:
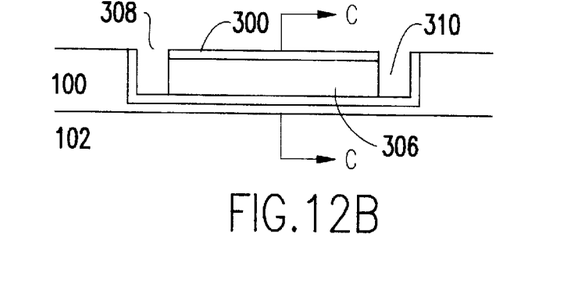
Figure 12C:
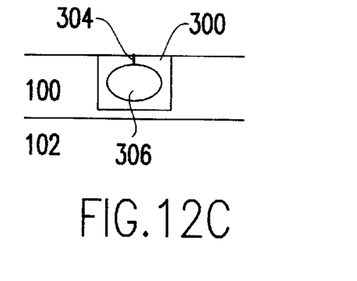

Next in FIGS. 12A–C, as in FIGS. 3A–C, an access 308, 310 is opened to the void 306 at each end of the second outer dielectric 300 and the void 306 is enlarged along the length of the second outer dielectric 300. Access holes 308, 310 are etched in the ends of the second outer dielectric 300 to expose the void 306. After opening the access holes 308, 310 the void 306 is etched with HF to enlarge it. Optionally, if the monofilament line is to be connected to a lower level, the access hole may be sub-etched below the bottom of the trench, preferably using reactive ion etching (RIE) to open a contact to connect the monofilament to a conductor (not shown) below it.

Figure 13A:
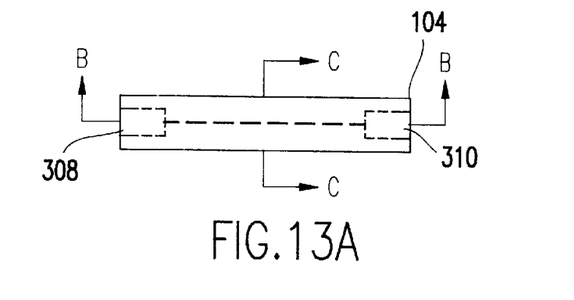
FIGS. 13A–C show conductor material filling the void.
Figure 13B:
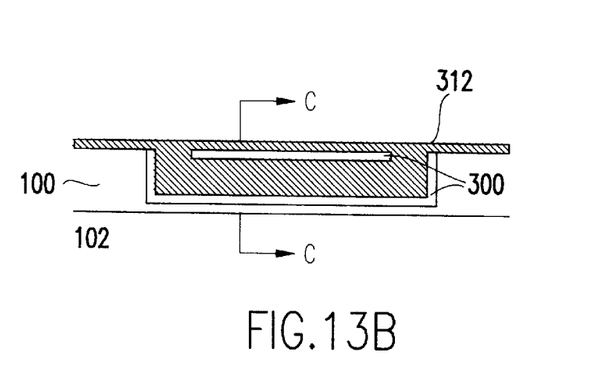
Figure 13C:
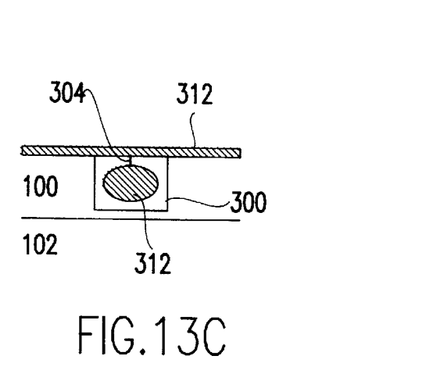

Next, in FIGS. 13A–C, the monofilament conductor 312 is formed along the length of the void 306. Preferably, the monofilament conductor 312 material is Cu or W formed by depositing a seed layer of TiN and then depositing W on the seed layer, preferably by CVD. Optionally, as with the first preferred embodiment, if the monofilament conductor length exceeds the CVD fill capability, intermediate access holes (not shown), identical to those formed 308, 310 at each end in the present example, may be included, as required, along the length of the trench 104.

Figure 14A:
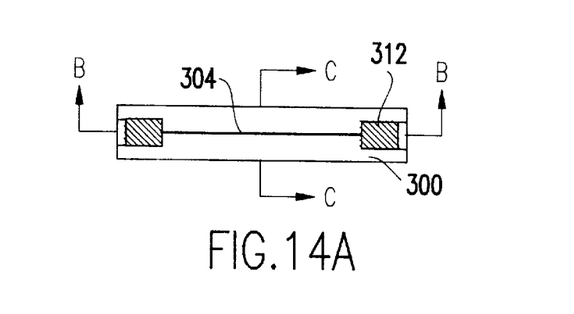
FIGS. 14A–C show the third preferred embodiment monofilament conductor.
Figure 14B:
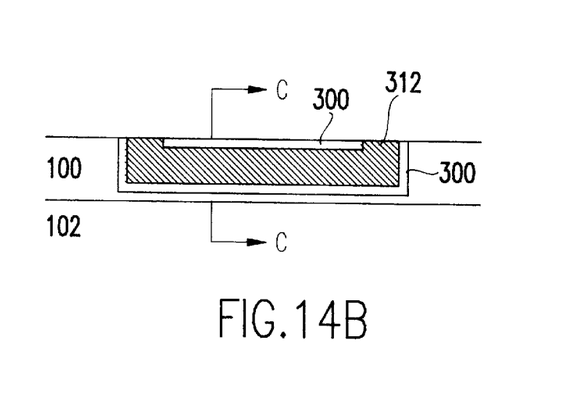
Figure 14C:
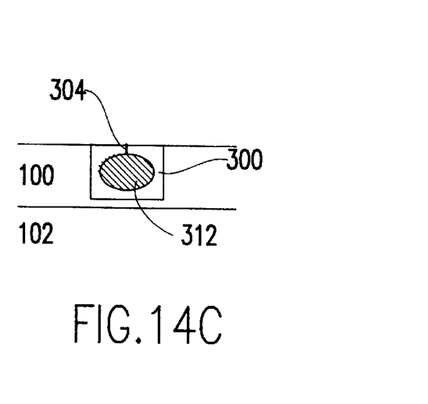

Finally, in FIGS. 14A–C, excess conductor is removed from the surface 312. The excess conductor may be removed using an appropriate CMP or RIE technique. Once the monofilament conductor is completed, the conductor may be contacted by standard semiconductor circuit connection methods.

While the invention has been described in terms of preferred embodiments, those skilled in the art will recognize that the invention can be practiced with modification within the spirit and scope of the appended claims.

We claim:

1. A method of making a conductor on an integrated circuit (IC) comprising the steps of:

a) forming a trench in an insulating material;

b) forming an outer layer of a first material on a bottom portion and sidewalls of said trench;

c) further forming said outer layer outward from said sidewalls on upper portions of said sidewalls of said trench;

d) seaming together said outer layer formed on said upper portions of said sidewalls thereby forming a void, said void running along a length and substantially underneath said seam and within said trench, said void being encapsulated within said outer layer;

e) opening access holes through said outer layer to said void; and f) filling said void with conducting material.

2. The method of claim 1 wherein said trench is formed by etching partially through said insulating material and said trench's depth exceeds its width.

3. The method of claim 1 wherein said insulating material is an $SiO_2$ layer and said trench is formed by reactive ion etching said $SiO_2$ layer.

4. The method of claim 1 wherein said trench is wider at it bottom than at its top.

5. The method of claim 1 wherein said trench is bowed out at its middle.

6. The method of claim 2 wherein said insulating material is an $SiO_2$ layer and said trench is formed by reactive ion etching said $SiO_2$ layer.

7. The method of claim 1 wherein the step (e) of opening the access holes further comprises etching the void to widen it.

8. The method of claim 1 wherein the step (f) of filling the void with conducting material comprises the steps of:
   i) depositing a seed layer;
   ii) depositing a conductor layer on said seed layer; and,
   iii) removing excess said deposited conductor layer material and seed layer material from said insulating material.

9. The method of claim 8 wherein the seed layer is a 50 Å TiN layer on a 50 Å Ti layer and the conductor layer material is W.

10. The method of claim 9 wherein said conductor is a monofilament conductor and said first material is a dielectric material.

11. The method of claim 10 wherein the dielectric material is $SiO_2$ deposited using CVD and the void is etched with HF to open it to 3000 Å.

12. The method of claim 1 wherein said conductor is a coaxial conductor, said first material is a conducting material and further comprising, before the step (f) of filling the void, the step of:
   e1) lining said void with an inner dielectric.

13. The method of claim 12 wherein the step (b) of forming the outer conducting layer comprises the steps of:
   i) depositing an outer conductor seed layer;
   ii) depositing an outer conductor layer on said outer conductor seed layer; and,
   iii) removing excess said deposited outer conductor layer material and outer conductor seed layer material from said insulating material.

14. The method of claim 13 wherein the outer conductor seed layer is a 50 Å TiN layer on a 50 Å Ti layer, the outer conductor layer material is W and the void is etched with $HNO_3$/HF to widen it to 3000 Å.

15. The method of claim 1 wherein said conductor is a clad conductor, said first material is a cladding material of Ta and the Ta cladding layer is etched with $HNO_3$/HF to widen it to 3000 Å.

16. The method of claim 1 wherein said first material is silicon nitride deposited using CVD and the void is etched with $H_3PO_4$ to widen it to 3000 Å.

17. A method of making a coaxial conductor on an integrated circuit (IC) comprising the steps of:
   a) etching a trench in an insulating layer;
   b) depositing an outer conductor layer on on a bottom portion and sidewalls of said trench;
   c) further forming said outer conductor layer outward from said sidewalls on upper portions of said sidewalls of said trench;
   d) seaming together said outer conductor layer formed on said upper portions of said sidewalls thereby forming a void, said void running along a length and substantially underneath said seam and within said trench, said void being encapsulated within said outer conductor layer;
   e) removing excess outer conductor material from said insulating layer;
   f) opening access holes through said outer conductor layer to said void;
   g) etching said outer conductor material in said void to widen said void;
   h) lining said void with an inner dielectric;
   i) depositing a core conductor, said core conductor filling said void; and
   j) removing excess core conductor material from said insulating layer.

18. The method of claim 17 wherein said insulating layer is an $SiO_2$ layer and the step (b) of depositing the outer conductor comprises the steps of:
   i) depositing an outer conductor seed layer;
   ii) depositing an outer conductor layer on said outer conductor seed layer; and,
   iii) removing excess said deposited outer conductor layer material and outer conductor seed layer material from said $SiO_2$.

19. The method of claim 18 wherein the inner dielectric is $SiO_2$ and the step (j) of depositing the core conductor comprises the steps of:
   i) depositing a seed layer;
   ii) depositing conductor material on said seed layer; and,
   iii) removing excess said deposited conductor material and seed layer material from said $SiO_2$.

20. The method of claim 19 wherein the core conductor seed layer and the outer conductor seed layer are each a 50 Å TiN layer on a 50 Å Ti layer, the core conductor and outer conductor material is W and the void is etched with $HNO_3$/HF to widen it to 3000 Å.

21. The method of claim 17 wherein the coaxial conductor is a triaxial conductor and further comprising, before the step (i) of depositing the core conductor, the steps of:
   h1) lining said void with an inner conductor layer;
   h2) opening access holes through said inner conductor layer;
   h2) lining said void with a second inner dielectric; and
   h2) opening access holes through said second inner dielectric layer.

22. A method of making a clad conductor on an integrated circuit (IC) comprising the steps of:
   a) etching a trench in an insulating layer;
   b) depositing a cladding layer on said insulating layer and on a bottom portion and sidewalls of said trench;
   c) forming said cladding layer outward from said sidewalls on upper portions of said sidewalls of said trench;
   d) seaming together said cladding layer formed on said upper portions of said sidewalls thereby forming a void, said void running along a length and substantially underneath said seam and within said trench, said void being encapsulated within said cladding layer;
   e) removing excess cladding material from said insulating layer;
   f) etching access holes through said cladding layer to said void;
   g) etching the surface of said cladding layer in said void to widen said void;
   h) depositing a seed layer, said seed layer lining said void;
   i) depositing conductor material on said seed layer; and,
   j) removing excess said deposited conductor material and seed layer material from said $SiO_2$.

23. The method of claim 22 wherein said cladding layer is a layer of Ta and the Ta cladding layer is etched with $HNO_3$/HF to widen the void to 3000 Å.

24. The method of claim 23 wherein said cladding layer is a layer of silicon nitride deposited using CVD and the silicon nitride cladding layer is etched with $H_3PO_4$ to widen the void to 3000 Å.

* * * * *

UNITED STATES PATENT AND TRADEMARK OFFICE
CERTIFICATE OF CORRECTION

PATENT NO. : 6,060,388
DATED : May 9, 2000
INVENTOR(S) : Hiroyuki Akatsu

It is certified that error appears in the above-identified patent and that said Letters Patent is hereby corrected as shown below:

On the Title page change the order of the inventors to:

Bradley P. Jones, Wappingers Fall New York; Hiroyuki Akatsu, Yorktown Heights New York; Russell H. Arndt, Wappingers Fall New York; George F. Ouimet, Millbrook New York Signed and Sealed this Twenty-sixth Day of June, 2001

*Attest:*

NICHOLAS P. GODICI
*Attesting Officer*    Acting Director of the United States Patent and Trademark Office